United States Patent [19]

Tomomura et al.

[11] Patent Number: 5,057,183
[45] Date of Patent: Oct. 15, 1991

[54] PROCESS FOR PREPARING EPITAXIAL II-VI COMPOUND SEMICONDUCTOR

[75] Inventors: Yoshitaka Tomomura; Masahiko Kitagawa, both of Nara, Japan

[73] Assignee: Sharp Kabushiki Kaisha, Osaka, Japan

[21] Appl. No.: 446,114

[22] Filed: Dec. 5, 1989

[30] Foreign Application Priority Data

Dec. 8, 1988 [JP] Japan ................. 63-310512
Mar. 31, 1989 [JP] Japan ................. 1-82896

[51] Int. Cl.$^5$ .......................... H01L 29/22
[52] U.S. Cl. .................... 156/610; 156/611; 156/DIG. 72; 156/DIG. 103
[58] Field of Search .......... 156/610, 611, DIG. 72, 156/DIG. 103; 437/105; 148/DIG. 64

[56] References Cited

U.S. PATENT DOCUMENTS

| | | | |
|---|---|---|---|
| 3,152,022 | 10/1964 | Christensen et al. | 156/610 |
| 3,929,527 | 12/1975 | Chang et al. | 156/610 |
| 4,058,430 | 11/1977 | Suntola et al. | 156/612 |
| 4,147,571 | 4/1979 | Stringfellow et al. | 156/610 |
| 4,159,919 | 7/1979 | McFee et al. | 156/610 |
| 4,233,092 | 11/1980 | Harris et al. | 156/610 |
| 4,330,360 | 5/1982 | Kubiak et al. | 156/610 |
| 4,383,872 | 5/1983 | Roberts | 156/610 |
| 4,526,809 | 7/1985 | Hall et al. | 156/611 |
| 4,575,462 | 11/1986 | Dobson et al. | 156/610 |
| 4,757,030 | 7/1988 | Galvin et al. | 156/610 |

OTHER PUBLICATIONS

English abstract and Japanese article of "ZnS Bulk Single Crystal Growth by Temperature Difference—Constant Temperature Method", in Sharp Technical Journal, vol. 37, 1987.
S. Kaneda et al., "Single Crystal Growth of ZnS by the Method of Gas Source MBE", *Journal of Crystal Growth*, 76 (1986), pp. 440–447.
K. Yoneda et al., "The Preparation of Conductive ZnS Films by Using MBE with a Single Effusion Source", *Journal of Crystal Growth*, 67 (1984), pp. 125–134.
R. G. Benz II et al., "Molecular Beam Epitaxial Growth and Structural Characterization of ZnS on (001) GaAs", *Journal of Crystal Growth*, 86 (1988), pp. 303–310.
M. Kitagawa et al., "Growth of ZnS Bulk Single Crystals and Homoepitaxial Growth of ZnS by Molecular Beam Epitaxy", *Extended Abstracts of the 19th Conference on Solid State Devices and Materials*, Tokyo, 1987, pp. 247–250.
J. H. Neave. et al., "A Correlation Between Electron Traps and Growth Processes in n-GaAs Prepared by Molecular Beam Epitaxy", *Appl. Phys. Lett.*, 36(4), Feb. 15, 1980, pp. 311–312.
H. Kunzel et al., "The Effect of $As_2$ and $As_4$ Molecular Beam Species on Photoluminescence of Molecular Beam Epitaxially Grown GaAs", *Appl. Phys. Lett.*, 37(4), Aug. 15, 1980, pp. 416–418.
Yao et al., Molecular Beam Epitaxy of Zinc Chalcogenides; *Journal of Crystal Growth* 53 (1981), 423–431.

Primary Examiner—Olik Chaudhuri
Assistant Examiner—Felisa C. Garrett
Attorney, Agent, or Firm—Sandler, Greenblum & Bernstein

[57] ABSTRACT

An improved process for the production of an epitaxial II-VI compound semiconductor containing sulfur as the VI element by molecular beam epitaxy employing a sulfur molecular beam and a II element molecular beam in which the sulfur molecular beam is provided from solid sulfur through a specific two-step heating.

12 Claims, 4 Drawing Sheets

PROCESS FOR PREPARING EPITAXIAL II-VI COMPOUND SEMICONDUCTOR

BACKGROUND OF THE BACKGROUND

1. Field of the Invention

The present invention relates to a process for epitaxially growing II-VI compound semiconductors containing sulfur as a composition element, such as zinc sulfide (ZnS) and zinc sulfo-selenide (ZnSSe).

2. Description of the Prior Art

II-VI compound semiconductors such as ZnS and ZnSSe have a wide forbidden band gap of the direct transition type and are highly promising as materials for devices for emitting high-luminance light in the region of ultraviolet to visible short wavelengths. However, control of the conduction type is indispensable to realize high-luminance luminescent devices. Research is under way on the growth of high-quality crystals with use of the molecular beam epitaxial (MBE) process, metal-organic vapor phase epitaxy (MOVPE) and like low-temperature epitaxial techniques and on the control of the conduction type.

In the MBE process for preparing II-VI compound semiconductors, such as ZnS and ZnSSe, containing sulfur, the sulfur molecular beam to be used is produced conventionally by decomposing hydrogen sulfide by heating ("SINGLE CRYSTAL GROWTH OF ZnS BY THE METHOD OF GAS SOURCE MBE," Journal of Crystal Growth, 76(1986) 440–448), or by heating a sulfide such as ZnS or simple sulfur using a Knudsen cell (K-cell)("THE PREPARATION OF CONDUCTIVE ZnS FILMS BY USING MBE WITH A SINGLE EFFUSION SOURCE," Journal of Crystal Growth, 67(1984) 125–134; "MOLECULAR BEAM EPITAXIAL GROWTH AND STRUCTURE CHARACTERIZATION OF ZnS ON (001)GaAs," ibid., 86(1988) 303–310; "Growth of ZnS Bulk Single Crystals and Homoepitaxial Growth of ZnS by Molecular Beam Epitaxy," Extended Abstract of the 19th Conference on Solid State Device and Materials, Tokyo, 1987, pp. 247–250).

However, when hydrogen sulfide or other sulfide is to be used, it is difficult to obtain the material with a high purity, and impurities become inevitably incorporated into the epitaxial film. Furthermore, the use of hydrogen sulfide involves the problem that molecules not participating in the growth, such as those of undecomposed hydrogen sulfide and hydrogen gas resulting from thermal decomposition, are present conjointly with the sulfur molecular beam on the grown surface. When ZnS or like sulfide is used, a zinc molecular beam occurs at the same time, and it is impossible to control the supplies of sulfur and zinc independently of each other, hence another problem.

On the other hand, the method of producing a molecular beam by heating solid sulfur with a K-cell has advantages. The material is readily available with a high purity, no vapor occurs other than the vapor of sulfur, and the supply of sulfur to the grown surface is controllable independently. Nevertheless, the method has the following problem.

The evaporation temperature required for giving a sulfur molecular beam with a suitable intensity of about $1 \times 10^{-7}$ to about $1 \times 10^{-5}$ torr is usually as low as about 100° C., so that the sulfur molecules projected on the surface of the layer to be grown have low thermal energy. Consequently, the sulfur molecules fail to diffuse fully over the surface to result in three-dimensional growth, making it impossible to inhibit occurrence of defects and presenting difficulty in forming a flat grown surface.

Thus, the conventional MBE process encounters difficulties in forming a ZnS or ZnSSe single crystal epitaxial film of high quality suitable as the light-emitting layer of highly efficient luminescent devices.

The present invention has been accomplished to overcome the above problems.

Incidentally, it has been proposed for the preparation of GaAs semiconductors to heat the vapor for supplying a molecular beam after the vapor has been produced ("A correlation between electron traps and growth processes in n-GaAs prepared by molecular beam epitaxy," Appl. Phys. Lett. 36, No. 4, 15 February 1980; "The effect of $As_2$ and $As_4$ molecular beam species on photoluminescence of molecular beam epitaxially grown GaAs," ibid., 37, No. 4, 1 August 1980), whereas this method has not been applied to MBE for sulfur-containing II-VI compound semiconductors.

SUMMARY OF THE INVENTION

The present invention provides a process for preparing an epitaxial II-VI compound semiconductor containing sulfur as VI element by molecular beam epitaxy employing a sulfur molecular beam and a II element molecular beam, the molecular beam epitaxy comprising the steps of heating solid sulfur at a temperature to obtain a sulfur vapor with a suitable vapor pressure for the molecular beam epitaxy and heating subsequently the vapor at a higher temperature to produce the sulfur molecular beam.

The present invention is based on the finding that a sulfur-containing II-VI compound semiconductor having excellent surface smoothness can be obtained with defects remarkably inhibited by MBE with use of a sulfur molecular beam which is obtained by heating simple sulfur approximately at the evaporation temperature thereof to prepare a sulfur vapor with a specified vapor pressure and subsequently heating the vapor to a temperature exceedingly higher than the evaporation temperature to obtain the beam.

BRIEF DESCRIPTION OF THE DRAWINGS

FIG. 1 (b) is a diagram of RHEED pattern of a ZnS epitaxial film prepared by conventional MBE;

FIG. 2 (b) is a photoluminescence spectrum diagram at 77K of the ZnS epitaxial film prepared by conventional MBE;

DESCRIPTION OF THE PREFERRED EMBODIMENTS

Figure 1A:
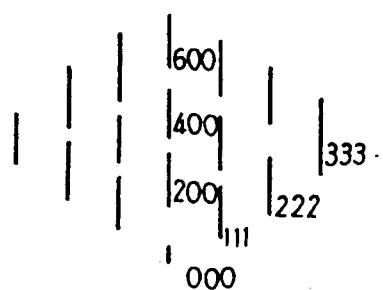
FIG. 1 (a) is a diagram of RHEED pattern of the ZnS epitaxial film prepared in Example 1 of the invention.

Examples of typical II-VI compound semiconductors to be produced according to the present invention are ZnS, CdS, HgS, BeS, MgS, CaS, SrS, BaS and the like. Other II-VI compound semiconductors which contain at least sulfur as a VI element and which can be prepared according to the invention include mixed crystal systems containing a plurality of II elements, such as ZnCdS, ZnHgS and CaHgS, mixed crystal systems containing a plurality of VI elements, such as ZnSSe, CdSSe, ZnSTe, CdSTe and ZnCdSSe, and mixed crystal systems, such as MnS, ZnMnS, containing a hetero-element (Mn). These compound semiconductors may of course be doped with impurities (such as Al, Cl, I, Li, Na, K, N, As and P) so as to obtain the desired conduction type, conductivity, etc. These compound semiconductors are each in the form of a film epitaxially grown on a specified crystal substrate.

According to the present invention, the compound semiconductor is prepared by molecular beam epitaxy using a II element molecular beam and a sulfur molecular beam.

The II element molecular beam can be supplied from a vapor of the corresponding II element using a Knudsen cell. A II element such as Zn, Cd, Hg, Ca, Be, Mg, Sr, Ba or the like can be used as it is as the source of such a II element.

The vapor pressure, evaporation temperature and like conditions of the vapor for supplying the II element molecular beam can be the known conditions for preparing II-VI compounds by MBE. To supply a Zn molecular beam, for example, it is suitable to evaporate the element at a temperature of 300° to 450° C. to obtain a vapor pressure of $1 \times 10^{-7}$ to $5 \times 10^{-6}$ torr.

On the other hand, the sulfur molecular beam can be supplied through a Knudsen cell from a vapor obtained from simple sulfur serving as its source. According to the present invention, the sulfur molecular beam is produced from simple sulfur by two-step heating. Simple sulfur is heated first to produce a sulfur vapor with a vapor pressure optimum for MBE. Preferably, the vapor pressure is about $1 \times 10^{-7}$ to about $1 \times 10^{-5}$ torr. The heating temperature suitable for giving the vapor of such a vapor pressure is about 50° to 150° C. The most distinct feature of the present invention is that the sulfur vapor of such a relatively low temperature is further heated to obtain a sulfur molecular beam from the resulting vapor instead of directly using the vapor of low temperature to obtain the molecular beam. It is suitable that the second heating be effected at a temperature exceedingly higher than that of the first heating, i.e., about 400° to about 1000° C. Preferably, this temperature is about 800° to about 1000° C. If the temperature is below 400° C., the compound semiconductor will not have a fully improved quality. Temperatures above 1000° C. are likely to permit components of the MBE apparatus to release an impurity vapor, adversely affecting the properties of the compound semiconductor to be obtained. Thus, temperatures outside of the above range are not suitable. Incidentally, even if simple sulfur is heated directly to 400° to 1000° C., it is impossible to obtain a vapor with a vapor pressure suited to MBE and therefore to obtain the desired sulfur molecular beam. As a result, the contemplated compound semiconductor can not be produced. The solid sulfur to be used preferably has the highest possible purity. It is suitable to use solid sulfur of more than 5N which is usually available.

The two-step heating and the supply of the molecular beams can be accomplished readily using a sulfur vapor producing container (which may be a Knudsen cell) having low-temperature heating means, and a heating cell connected to the container and provided with high-temperature heating means for heating the sulfur vapor from the container and with a molecular beam supplying aperture or shutter at the upper portion of the cell.

The II element molecular beam and the sulfur molecular beam are projected on a crystal substrate, whereby a II-VI compound semiconductor is epitaxially grown. In this step, at least two kinds of II element molecular beams may be projected in combination, or the sulfur molecular beam may be used in combination with another VI element molecular beam. A hetero-element molecular beam or doping impurity molecular beam may further be used conjointly with these beams. It is suitable that the molecular beams be projected in an ultra-high vacuum of the order of $10^{-8}$ to $10^{-10}$ torr so as to be prevented from contamination to the greatest possible extent. The vacuum is preferably of the order of $10^{-10}$ torr. The temperature of the crystal substrate is suitably 100° to 650° C.

The process of the present invention produces a II-VI compound semiconductor having remarkably higher characteristics than heretofore available for a reason which has yet to be clarified. Presumably, however, the reason will be as follows. The sulfur molecular beam obtained from a vapor which is prepared by heating simple sulfur and further heating the resulting sulfur vapor to a temperature higher than the evaporation temperature thereof has an optimum pressure (usually of the order of $10^{-7}$ to $10^{-5}$ torr) and high thermal energy. This promotes the diffusion of sulfur molecules over the surface of the layer to be grown to result in two-dimensional growth, making it possible to produce a film having a high degree of surface smoothness with defects inhibited.

EXAMPLES

Example 1

The process of the present invention for preparing epitaxial compound semiconductors is described in detail with reference to the growth of ZnS.

The sulfur molecular beam source used in the present example was one having two heating portions, i.e., a low-temperature heating portion for heating the material to produce a material vapor with the desired pressure and a high-temperature heating portion for heating the vapor to a temperature higher than the evaporation temperature of the material. The material used was solid sulfur, 5N in purity. The intensity of the sulfur molecular beam was controlled according to the temperature of the low-temperature heating portion, i.e., according to the evaporation temperature of sulfur. It was found suitable to set the low-temperature heating portion to a temperature of 50° to 150° C. in order to obtain a molecular beam pressure of $1 \times 10^{-7}$ to $1 \times 10^{-5}$ torr. The high-temperature heating portion was set to a temperature of 800° C. The zinc molecular beam used was produced from simple zinc, 6N in purity, using a usual K-cell.

Figure 5:
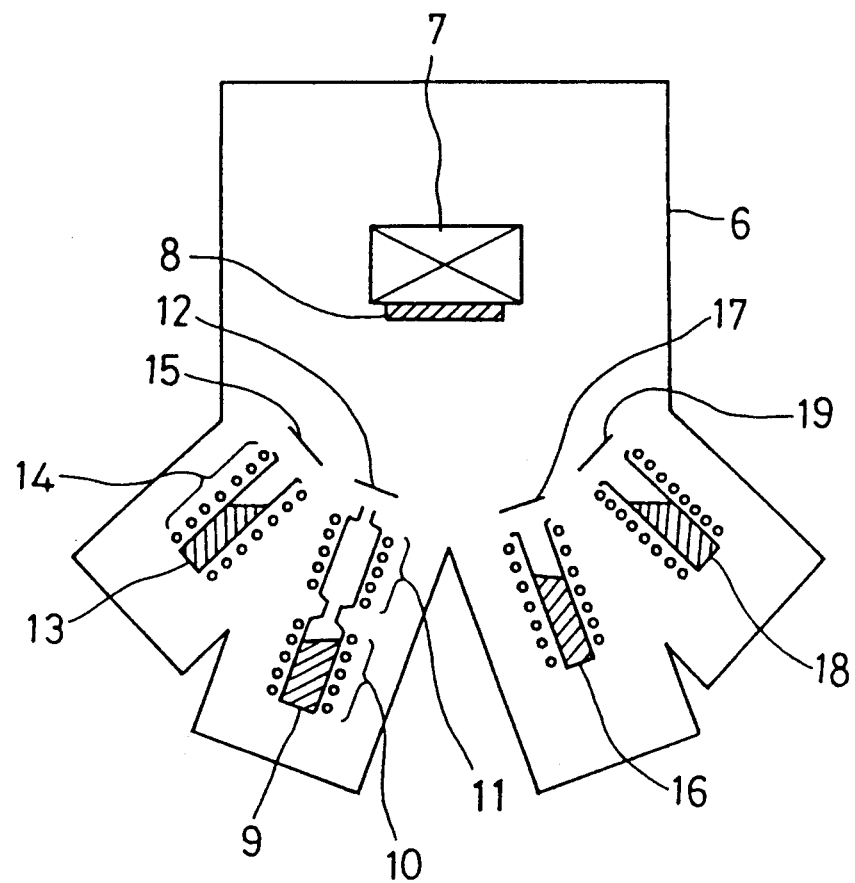
FIG. 5 is a diagram showing an MBE apparatus used for Examples.

FIG. 5 shows the basic construction of the MBE apparatus used in the present example. The drawing shows an ultra-high-vacuum chamber 6, substrate heating table 7, crystal substrate 8, sulfur molecular beam source 9 comprising solid sulfur, low-temperature heating means 10, high-temperature heating means 11, II element molecular beam source 13 comprising solid zinc, heating means 14, and molecular beam sources 16, 18 optionally provided for other II or VI element or impurity element. Indicated at 12, 15, 17, 19 are shutters for supplying the respective molecular beams.

The crystal substrate used was a wafer of ZnS(100) prepared from ZnS bulk single crystal grown by the iodine transport method. The substrate was set to a temperature of 260° C. The intensities of the sulfur and zinc molecular beams were set to $5 \times 10^{-6}$ torr and $1 \times 10^{-6}$ torr, respectively. The sulfur and zinc evaporation temperatures were 100° C. and 350° C., respectively.

Figure 1A:
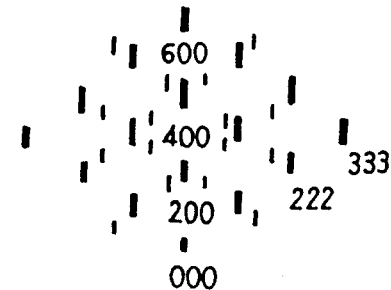
Figure 2A:
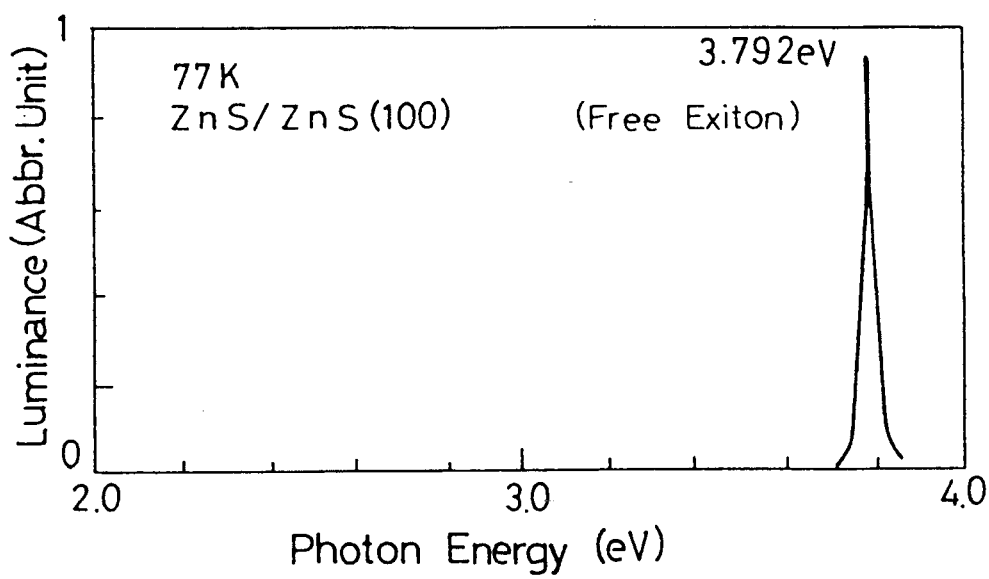
FIG. 2 (a) is a photoluminescence spectrum diagram at 77K of the ZnS epitaxial film prepared in Example 1 of the invention.
Figure 2B:
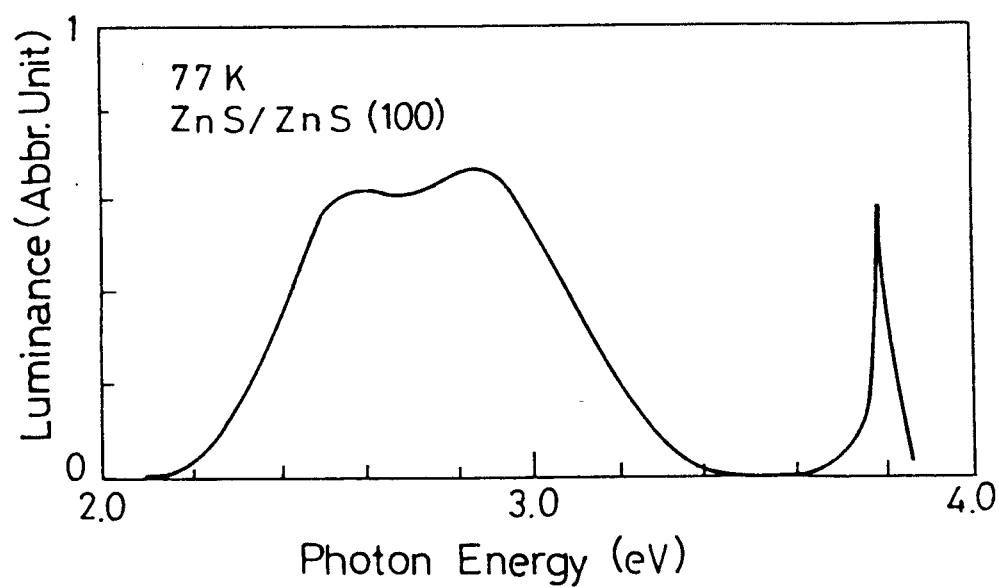

A layer was grown under the above conditions for 3 hours. FIG. 1 (a) shows the reflection high energy electron diffraction (RHEED) pattern of the grown layer. The drawing shows a single crystal diffraction pattern having streaks. The layer obtained was a single crystal epitaxial film having a good quality and excellent surface smoothness. Observation under a differential interference microscope revealed no apparent surface structure, indicating a high degree of surface smoothness. As seen in FIG. 2 (a), the film obtained exhibited intense free exciton luminescence having a peak at 3.792 eV in a photoluminescence (PL) spectrum at 77K. No luminescence from a deep level was observed. The film grown was about one micrometer in thickness.

On the other hand, when sulfur molecules of smaller thermal energy were projected at the same substrate temperature and molecular beam intensity as in the example described above, using a usual K-cell conventionally employed as the sulfur molecular beam source, the RHEED pattern obtained had spots due to a twin crystal as shown in FIG. 1 (b). The crystal surface exhibited wavy morphology extending in the (011) direction and was studded with minute hillocks. Band edge luminescence and luminescence from a deep level were observed in a photoluminescence spectrum at 77K as seen in FIG. 2 (b).

Thus, it has been found that the MBE process of the invention affords a ZnS single crystal epitaxial film which is higher than conventional ones in crystallinity, degree of surface smoothness and quality.

Example 2

A ZnSe-ZnSSe super lattice layer was grown in this example as is described below in detail.

Figure 3:
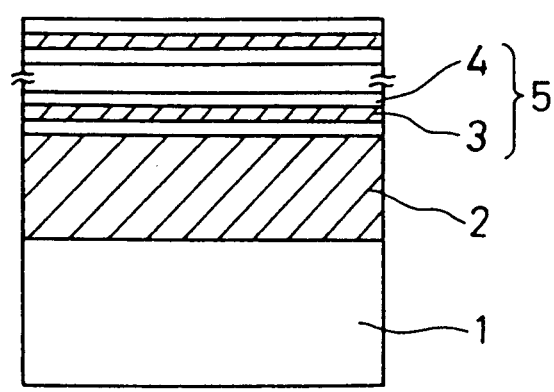
FIG. 3 is a sectional view schematically showing the $ZnSe-ZnS_{0.5}Se_{0.5}$ super lattice layer prepared in Example 2 of the invention.

FIG. 3 is a diagram in section showing the ZnSe-ZnSSe super lattice layer prepared. A ZnSe epitaxial layer 2 was grown to a thickness of 1 microepitaxial meter on a ZnS(100) substrate 1 formed by the iodine transport process. Subsequently formed on the layer 2 was a ZnSe-ZnS$_{0.5}$Se$_{0.5}$ super lattice layer 5 comprising two layers, i.e., a ZnSe lattice layer 3 having a thickness of 20 angstroms and a ZnS$_{0.5}$Se$_{0.5}$ lattice layer 4 having a thickness of 20 angstroms.

The selenium molecular beam source used in the present example was similar in construction to the sulfur molecular beam source used in Example 1. The high-temperature heating portion was set to a temperature of 800° C. as in the case of sulfur. It was found suitable to set the low-temperature heating portion to a selenium evaporation temperature of 200° to 400° C. in order to obtain a selenium molecular beam pressure of $1 \times 10^{-7}$ to $1 \times 10^{-5}$ torr. The ZnSe epitaxial layer 2 and the ZnSe lattice layer 3 were grown at a zinc molecular beam pressure of $1 \times 10^{-6}$ torr and a selenium molecular beam pressure of $1 \times 10^{-6}$ torr. The ZnS$_{0.5}$Se$_{0.5}$ lattice layer 4 was formed using a sulfur molecular beam in addition to the zinc and selenium molecular beams. It was found suitable to set the sulfur molecular beam pressure to $5 \times 10^{-6}$ torr in order to obtain the mixed crystal composition of ZnS$_{0.5}$Se$_{0.5}$.

The ZnSe-Zn$_{0.5}$Se$_{0.5}$ super lattice layer 5 thus prepared exhibited in its X-ray diffraction spectrum a distinct satellite diffraction peak due to a super lattice structure. Further in a photoluminescence spectrum at 77K, sharp intense luminescence up to 7 meV in half-value width and with a peak at 2.90 eV was observed. Thus, the ZnSe-ZnSSe super lattice obtained was excellent in interface steepness and uniformity of thickness and had a high quality and satisfactory luminescence characteristics suitable for an EL device.

Example 3

In this example, a detailed description will be given of the growth of ZnS on a ZnS(100) substrate and a substrate slanting at 4 to 5 degrees toward the direction of from (100) to (011), at varying molecular beam intensities.

The sulfur molecular beam source used in the present example was one having two heating portions, i.e., a low-temperature heating portion for heating the same material as used in Example 1 to produce a material vapor with the desired pressure and a high-temperature heating portion for heating the vapor to a temperature higher than the evaporation temperature of the material. The material used was simple sulfur, 5N in purity. The intensity of the sulfur molecular beam was controlled according to the temperature of the low-temperature heating portion, i.e., according to the evaporation temperature of sulfur. It was found suitable to set the low-temperature heating portion to a temperature of 50 to 150° C. in order to obtain a molecular beam pressure of $1 \times 10^{-7}$ to $1 \times 10^{-5}$ torr. The high-temperature heating portion was set to a temperature of 800° C. The zinc molecular beam used was produced from solid zinc, 6N in purity, using an aforementioned K-cell.

The crystal substrates used were ZnS(100) wafers prepared from a ZnS bulk single crystal grown by the iodine transport method, and wafers having an off angle of 4 to 5 degrees toward the direction of from (100) to (011) (hereinafter referred to as "(100) 4- to 5-degree off substrates"). The substrate was set to a temperature of 260° C. The intensities of the sulfur and zinc molecular beams were altered over the respective ranges of $1.6 \times 10^{-6}$ torr to $3.7 \times 10^{-6}$ torr, and $1.0 \times 10^{-7}$ torr to $1.8 \times 10^{-6}$ torr, using the above molecular beam sources, such that the ratio of the sulfur molecular beam intensity to the zinc molecular beam intensity (hereinafter referred to as the "molecular beam intensity ratio Ps/Pzn") was in the range of 1 to 32. The sulfur and zinc materials were 50° to 80° C. and 300° to 380° C., respectively, in evaporation temperature.

Figure 4:
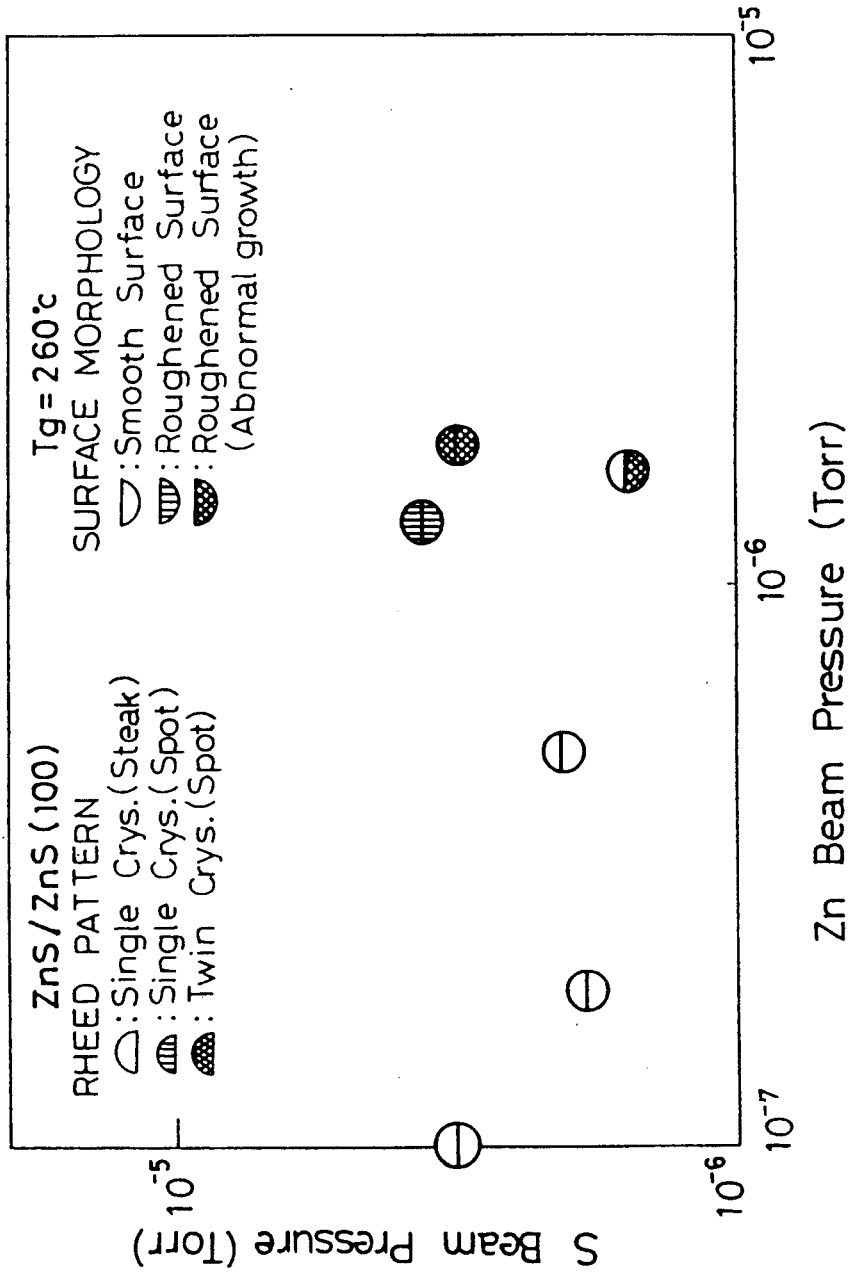
FIG. 4 is a diagram illustrating the characteristics of the ZnS thin film prepared in Example 3 of the invention.

ZnS was grown under the foregoing conditions for 3 hours. The crystallinity and the surface smoothness of the layer grown on the (100) substrate, as well as on the (100) 4- to 5-degree off substrate, were dependent on the molecular beam intensity ratio Ps/Pzn (FIG. 4). In the range where this ratio Ps/Pzn was great (at least about 3), the grown layer exhibited a single crystal diffraction pattern with streaks but no apparent surface structure when observed under a Nomarski differential interference microscope. Thus, high molecular beam intensity ratios are effective for giving ZnS single crystal thin films of high quality which are excellent in crystallinity and surface smoothness. On the other hand, in the range of small molecular beam intensity ratios (less than about 3), the RHEED pattern presented spots. At smaller ratios Ps/Pzn, the layer exhibited a diffraction pattern due to a twin crystal. When observed microscopically, minute surface irregularities were seen, and hillocks were found at smaller molecular beam intensity ratios Ps/Pzn. Thus, in the range of small ratios Ps/Pzn (less than about 3), the layer exhibited impaired crystallinity and lower surface smoothness.

Under the foregoing growth conditions, the rate of growth was in proportion to the square of the sulfur molecular beam intensity and was controlled down to 0.02 $\mu$m/h. For example, in the case where ZnS was grown on the (100) 4- to 5-degree off substrate, the growth rate was 0.02 $\mu$m/h to 0.1 $\mu$m/h when the sulfur molecular beam intensity was in the range of $1.6 \times 10^{-6}$ to $3.7 \times 10^{-16}$ torr. The growth rate was variable in the range of about one order of magnitude with good controllability by varying the sulfur molecular beam intensity over the range of $1.6 \times 10^{-6}$ to $3.7 \times 10^{-6}$. Especially, the growth rate, when set to a low value of about 0.02 $\mu$m/h, was useful for controlling the film thickness with the accuracy in monoatomic layer units. Further the growth rate on the (100) 4- to 5-degree off substrate was about 2.5 times the growth rate on the (100) substrate. The former substrate is therefore useful for growing ZnS thin films in a shorter period of time.

Briefly stated, the range in which the ratio of the sulfur molecular beam intensity to the zinc molecular beam intensity is great (at least about 3) enables the MBE process of the invention to produce films of excellent crystallinity and surface smoothness with the film thickness controlled accurately. High intensity ratios are thus very useful for forming ZnS films alone, or in combination with ZnSe or the like to produce a super lattice layer and also for producing other extremely thin film structures while ensuring good controllability. Furthermore, the use of (100) 4- to 5-degree off substrates in the MBE process of the invention achieves about 2.5 times the growth rate on (100) substrates and is very effective for shortening the film forming time.

In preparing compound semiconductors containing sulfur as a composition element by MBE, the process of the present invention employs a sulfur molecular beam obtained by heating solid sulfur serving as the source of the beam and further heating the resulting sulfur vapor to a temperature higher than the evaporation temperature of sulfur as described in detail above. This makes it possible to obtain ZnS, ZnSSe or like single crystal epitaxial films having a high quality and suited as the light-emitting layers of high-efficiency ultraviolet or visible luminescent devices, or to obtain a super lattice light-emitting layers having a high quality and made of such materials.

What we claim is:

1. A process for preparing an epitaxial II-VI compound semiconductor containing sulfur as a VI element by molecular beam epitaxy employing a sulfur molecular beam and a II element molecular beam, the molecular beam epitaxy comprising the steps of heating solid sulfur at a first temperature to obtain a sulfur vapor with a suitable vapor pressure for the molecular beam epitaxy, and subsequently heating the sulfur vapor at a second temperature higher than said first temperature to produce the sulfur molecular beam.

2. The process of claim 1 in which the heating of said solid sulfur is effected at a temperature of about 50° to 150° C.

3. The process of claim 1 in which the sulfur vapor has a vapor pressure of about $1 \times 10^{-7}$ to $1 \times 10^{-5}$ torr.

4. The process of claim 1 in which the heating of the sulfur vapor is effected at a temperature of about 400° to 1000° C.

5. The process of claim 1 in which the sulfur molecular beam is supplied through a Knudsen cell.

6. The process of claim 1 in which the II element molecular beam is selected from the group consisting of Zn, Cd, Hg, Be, Mg, Ca, Sr and Ba.

7. The process of claim 1 in which a molecular beam of a VI element other than sulfur or of a hetero element is further employed in the molecular beam epitaxy.

8. The process of claim 1 in which the epitaxial II-VI compound semiconductor is of ZnS, CdS, HgS, MgS, CaS, ZnCdS, ZnHgS, CaHgS, ZnSSe, CdSSe, ZnSTe, CdSTe, ZnCdSSe, MnS or ZnMnS.

9. The process of claim 1 which is used for producing a light-emitting layer of a luminescent device.

10. The process of claim 9 in which the light-emitting layer has a super lattice structure.

11. The process of claim 1, wherein said sulfur molecular beam and said II element molecular beam have intensities whereby the ratio of said sulfur molecular beam intensity to said II element molecular beam intensity is equal to about 3 or greater.

12. The process of claim 1, wherein said first temperature is a temperature near the evaporation temperature of said solid sulfur.

* * * * *